(12) United States Patent
Zhang et al.

(10) Patent No.: US 12,074,258 B2
(45) Date of Patent: Aug. 27, 2024

(54) LIGHT EMITTING DIODE CHIP AND METHOD FOR MANUFACTURING THE SAME, DISPLAY DEVICE

(71) Applicant: BOE TECHNOLOGY GROUP CO., LTD., Beijing (CN)

(72) Inventors: Lizhen Zhang, Beijing (CN); Guangcai Yuan, Beijing (CN); Qi Yao, Beijing (CN); Mingxing Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 462 days.

(21) Appl. No.: 17/332,852

(22) Filed: May 27, 2021

(65) Prior Publication Data

US 2022/0115562 A1 Apr. 14, 2022

(30) Foreign Application Priority Data

Oct. 14, 2020 (CN) .......................... 202011099277.6

(51) Int. Cl.
| | | |
|---|---|---|
| *H01L 33/38* | (2010.01) | |
| *H01L 27/15* | (2006.01) | |
| *H01L 33/00* | (2010.01) | |
| *H01L 33/12* | (2010.01) | |
| *H01L 33/62* | (2010.01) | |

(52) U.S. Cl.
CPC .......... *H01L 33/382* (2013.01); *H01L 27/156* (2013.01); *H01L 33/005* (2013.01); *H01L 33/12* (2013.01); *H01L 33/62* (2013.01); *H01L 2933/0016* (2013.01)

(58) Field of Classification Search
CPC ... H01L 33/382; H01L 27/156; H01L 33/005; H01L 33/12; H01L 33/62; H01L 2933/0016; H01L 25/0753; H01L 33/38; H01L 33/20; H01L 33/385; H01L 33/08; H01L 33/007
See application file for complete search history.

(56) References Cited

U.S. PATENT DOCUMENTS

| | | | | |
|---|---|---|---|---|
| 2010/0314642 A1* | 12/2010 | Kudo | ................... | H01L 33/0093 257/E33.068 |
| 2016/0087143 A1* | 3/2016 | Teo | ......................... | H01L 33/22 438/47 |
| 2016/0190396 A1* | 6/2016 | Lee | ......................... | H01L 33/32 257/13 |

* cited by examiner

*Primary Examiner* — Su C Kim
(74) *Attorney, Agent, or Firm* — HOUTTEMAN LAW LLC

(57) ABSTRACT

An embodiment of the present disclosure provides a light emitting diode chip, including: a light emitting functional layer including a first semiconductor layer, a light emitting layer and a second semiconductor layer which are sequentially stacked, and a second semiconductor layer including a plurality of second semiconductor patterns which are arranged at intervals; a first electrode layer including a first electrode pattern electrically coupled to the first semiconductor layer; a second electrode layer disposed on a side, away from the light emitting layer, of the second semiconductor layer and including a plurality of second electrode patterns in one-to-one correspondence with the second semiconductor patterns, and the second electrode patterns are electrically coupled to the second semiconductor patterns correspondingly. Embodiments of the present disclosure further provide a method for manufacturing a light emitting diode chip and a display device.

6 Claims, 6 Drawing Sheets

LIGHT EMITTING DIODE CHIP AND METHOD FOR MANUFACTURING THE SAME, DISPLAY DEVICE

CROSS-REFERENCE TO RELATED APPLICATIONS

The present application claims the priority of Chinese Patent Application No. 202011099277.6, filed on Oct. 14, 2020, the contents of which are incorporated herein in their entirety by reference.

TECHNICAL FIELD

The present disclosure relates to the field of display, and in particular to a light emitting diode chip, a method for manufacturing a light emitting diode chip, and a display device.

BACKGROUND

A micro light emitting diode (micro inorganic light emitting diode) is of a self-luminous structure, requires no backlight source, and has a size of only about 1 μm to 10 μm. The essence of a micro inorganic light emitting diode display device is a micro light emitting diode (LED) array, namely, after a designed structure of inorganic light emitting diode chips is thinned, miniaturized and arrayed, a large number of micro inorganic light emitting diode chips are transferred to a driving substrate in batches, then a protective layer is generated by utilizing a physical deposition technology, and then the substrate is packaged, so that the micro inorganic light emitting diode display device can be obtained finally.

At present, each micro inorganic light emitting diode chip in the micro inorganic light emitting diode display device is an independent particle, and in the transferring process, the amount of particles of the inorganic light emitting diode chips transferred each time is very large, and the requirements on the stability and the accuracy of the transferring process are very high.

SUMMARY

In a first aspect, an embodiment of the present disclosure provides a light emitting diode chip, including:

a light emitting functional layer including a first semiconductor layer, a light emitting layer and a second semiconductor layer which are sequentially stacked, and the second semiconductor layer includes a plurality of second semiconductor patterns which are arranged at intervals;

a first electrode layer including a first electrode pattern electrically coupled to the first semiconductor layer; and a second electrode layer disposed on a side, away from the light emitting layer, of the second semiconductor layer and including a plurality of second electrode patterns in one-to-one correspondence with the second semiconductor patterns, and the second electrode patterns are electrically coupled to the second semiconductor patterns correspondingly.

In some implementations, the first electrode pattern is disposed on a side surface of the first semiconductor layer.

In some implementations, the first electrode pattern is in contact with the side surface of the first semiconductor layer.

In some implementations, the light emitting diode chip further includes: an insulating layer;

the insulating layer is disposed on a side, away from the light emitting layer, of the second semiconductor layer, and a plurality of via holes corresponding to the second semiconductor patterns are formed in the insulating layer;

the second electrode layer is disposed on a side, away from the second semiconductor layer, of the insulating layer, and the second electrode patterns are electrically coupled to the second semiconductor patterns correspondingly through the via holes.

In some implementations, the light emitting diode chip further includes: a transparent electrode positioned between the second electrode pattern and the second semiconductor pattern corresponding to the second electrode pattern.

In some implementations, an orthographic projection of the light emitting layer on a plane where the first semiconductor layer is located is in a area where the first semiconductor layer is located, and the orthographic projection of the light emitting layer on the plane where the first semiconductor layer is located covers a partial area of the first semiconductor layer.

In some implementations, the light emitting diode chip further includes: a buffer layer disposed on a side, away from the light emitting layer, of the first semiconductor layer.

In a second aspect, an embodiment of the present disclosure further provides a display device, including: the light emitting diode chip as provided in the first aspect.

In some implementations, the display device further includes: a driving substrate;

the driving substrate includes a driving functional layer and a pixel defining layer, where the driving functional layer includes a plurality of first coupling terminals, the pixel defining layer defines a plurality of pixel accommodating holes, and each of the pixel accommodating holes corresponds to one or more of the light emitting diode chips;

more than one of the first coupling terminals are disposed in each of the pixel accommodating holes, and each of the light emitting diode chips is flip-mounted in a corresponding one of the pixel accommodating holes, and the second electrode patterns of said each of the light emitting diode chips are electrically coupled to the first coupling terminals in the corresponding one of the pixel accommodating holes.

In some implementations, the first electrode pattern is disposed on a side of the first semiconductor layer, and at least a part of the first electrode pattern protrudes from a side of the pixel accommodating hole away from the driving functional layer.

In some implementations, each of the pixel accommodating holes corresponds to more than one of the light emitting diode chips;

for the light emitting diode chips corresponding to a same one of the pixel accommodating holes, first electrode patterns of adjacent ones of the light emitting diode chips are in contact with each other.

In some implementations, each of the pixel accommodating holes is configured with at least one second coupling terminal, the second coupling terminal is disposed on a side of the pixel defining layer away from the driving functional layer, and the second coupling terminal is electrically coupled to a corresponding signal line in the driving functional layer;

for the light emitting diode chips corresponding to a same one of the pixel accommodating holes, the first electrode pattern of at least one of the light emitting diode chips disposed on an outermost side is electrically coupled to the second coupling terminal corresponding to the pixel accommodating hole.

In some implementations, each of the pixel accommodating holes corresponds to one of the light emitting diode chips, and a conductive electrode is disposed on a side of the pixel accommodating holes away from the driving functional layer;

the first electrode patterns of the light emitting diode chips are electrically coupled through the conductive electrode.

In a third aspect, an embodiment of the present disclosure further provides a method for manufacturing a light emitting diode chip, which is suitable for manufacturing the light emitting diode chip of the first aspect, where the method includes:

forming a light emitting functional layer on a side of a substrate, where the light emitting functional layer includes a first semiconductor layer, a light emitting layer and a second semiconductor layer which are sequentially stacked, and the second semiconductor layer includes a plurality of second semiconductor patterns which are arranged at intervals;

forming a first electrode layer on a side of the substrate formed with the light emitting functional layer, where the first electrode layer includes a first electrode pattern, and the first electrode pattern is electrically coupled to the first semiconductor layer; and forming a second electrode layer on a side of the second semiconductor layer away from the light emitting layer, where the second electrode layer includes a plurality of second electrode patterns which correspond to the second semiconductor patterns one to one, and the second electrode patterns are electrically coupled to the second semiconductor patterns correspondingly.

In some implementations, the forming the light emitting functional layer on the side of the substrate includes:

sequentially forming a first semiconductor material film, a light emitting material film and a second semiconductor material film on the substrate;

patterning the second semiconductor material film to obtain the second semiconductor layer, where the second semiconductor layer includes the plurality of second semiconductor patterns arranged at intervals;

patterning the light emitting material film to obtain the light emitting layer;

patterning the first semiconductor material film to obtain a pattern of the first semiconductor layer, where an orthographic projection of the light emitting layer on a plane where the first semiconductor layer is located is in the area where the first semiconductor layer is located, and the orthographic projection of the light emitting layer on the plane where the first semiconductor layer is located covers a partial area of the first semiconductor layer;

the forming the first electrode layer on the side of the substrate formed with the light emitting functional layer includes:

forming a first electrode material film on a side of the second semiconductor layer away from the light emitting layer, where the first electrode material film covers a side surface of the first semiconductor layer; and performing a patterning process on the first electrode material film to obtain the first electrode pattern, where the first electrode pattern is disposed on the side surface of the first semiconductor layer and is in contact with the side surface of the first semiconductor layer.

DESCRIPTION OF EMBODIMENTS

In order to make those skilled in the art better understand technical solutions of the present disclosure, the following describes a light emitting diode chip, a method for manufacturing a light emitting diode chip and a display device provided in the present disclosure in detail in conjunction with the attached drawings.

Figure 1:
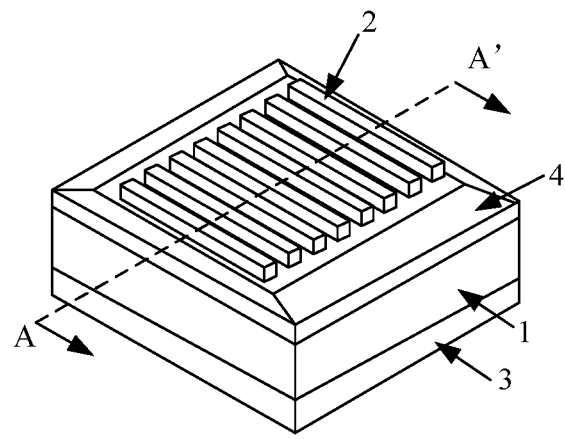
FIG. 1 is a schematic structural diagram of a light emitting diode chip according to an embodiment of the present disclosure.
Figure 2:
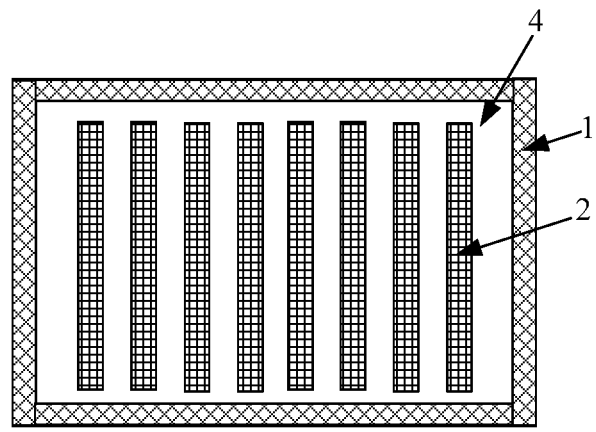
FIG. 2 is a top view of the structure in FIG. 1.
Figure 3:
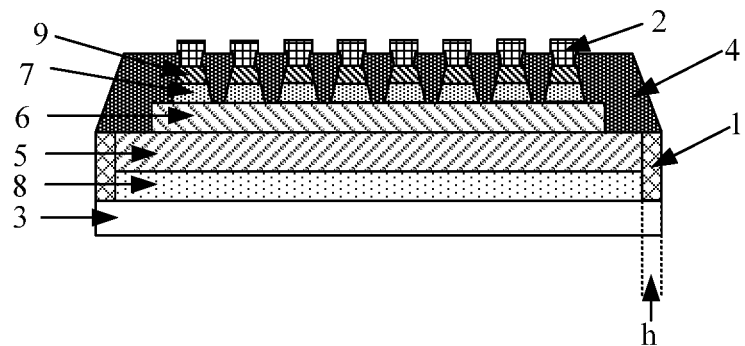
FIG. 3 is a schematic cross-sectional view taken along line A-A' of FIG. 1.

FIG. 1 is a schematic structural diagram of a light emitting diode chip according to an embodiment of the present disclosure, FIG. 2 is a schematic top view of the structure in FIG. 1, and FIG. 3 is a schematic cross-sectional view taken along line A-A' in FIG. 1, as shown in FIG. 1 to FIG. 3, the light emitting diode chip includes a light emitting functional layer, a first electrode layer, and a second electrode layer.

The light emitting functional layer includes a first semiconductor layer 5, a light emitting layer 6, and a second semiconductor layer which are sequentially stacked. In the embodiment of the present disclosure, one of the first semiconductor layer 5 and the second semiconductor layer is a p-type semiconductor layer, and the other is an n-type semiconductor layer; in the embodiment of the present disclosure, the first semiconductor layer 5 is exemplified as an n-type semiconductor layer, and the second semiconductor layer is exemplified as a p-type semiconductor layer. In some implementations, a material of the first semiconductor layer 5 is n-type gallium nitride (n-GaN), and a material of the second semiconductor layer is p-type gallium nitride (p-GaN); the n-GaN may be obtained by doping a silicon element in a GaN material, and the p-GaN may be obtained by doping a magnesium element in a GaN material.

The second semiconductor layer includes a plurality of second semiconductor patterns 7 arranged at intervals. It should be noted that, the drawings only show a case that the second semiconductor patterns 7 of the second semiconductor layer are in the shape of stripes and the second semiconductor patterns 7 are arranged in parallel along a preset direction, which only serves as an exemplary function and does not limit the technical solution of the present disclosure. In the present disclosure, the shapes and arrangement of the second semiconductor patterns 7 are not particularly limited.

The first electrode layer includes a first electrode pattern 1, and the first electrode pattern 1 is electrically coupled to the first semiconductor layer 5. A material of the first electrode layer may be selected from metal materials, such as at least one of copper, aluminum, and molybdenum.

The second electrode layer is disposed on a side of the second semiconductor layer away from the light emitting layer 6, the second electrode layer includes a plurality of second electrode patterns 2 corresponding to the second semiconductor patterns 7 one to one, and the second electrode patterns 2 are electrically coupled to the second semiconductor patterns 7 correspondingly. A material of the second electrode layer may be selected from metal materials, such as at least one of copper, aluminum, and molybdenum.

In the embodiment of the present disclosure, each of the second electrode patterns 2, the second semiconductor pattern 7 corresponding to said each of the second electrode patterns 2, the light emitting layer 6, the first semiconductor layer 5 and the first electrode pattern 1 are regarded as an independent light emitting element, i.e., the light emitting layer 6, the first semiconductor layer 5 and the first electrode pattern 1 are shared by a plurality of light emitting elements. Dimensionally, each light emitting element may be considered as a small-sized (micro) inorganic light emitting diode chip, and the entire inorganic light emitting diode chip of the embodiment of the present disclosure may be considered as a sub-millimeter inorganic light emitting diode chip composed of a plurality of small-sized (micro) inorganic light emitting diode chips.

In a process of manufacturing a micro inorganic light emitting diode display device, under the condition that the number of the micro inorganic light emitting diode chips required to be transferred in each transferring process is certain, compared with the condition that each micro inorganic light emitting diode chip is an independent particle, the technical solution disclosed by the present disclosure can greatly reduce the amount of particles of the inorganic light emitting diode chips in each transferring process, so that the requirements on the stability and the accuracy of the transferring process are reduced, and the yield is favorably improved.

For example, if the number of micro inorganic light emitting diode chips to be transferred per transferring process is a, in the case that each micro inorganic light emitting diode chip is an independent particle, the amount of particles of the inorganic light emitting diode chips to be transferred per transferring process is a; in the case of using the inorganic light emitting diode chip provided by the embodiment of the present disclosure and finely dividing the inorganic light emitting diode chip into b (b is an integer greater than 2) micro inorganic light emitting diode chips, the amount of particles of the inorganic light emitting diode chips required to be transferred in each transferring process is a/b, and a/b<a. Therefore, with the inorganic light emitting diode chip provided by the embodiment of the present disclosure, not only a display requirement of the micro inorganic light emitting diode is satisfied, but also the amount of particles of the inorganic light emitting diode chips required to be transferred in each transferring process can be reduced.

It should be noted that, in the embodiment of the present disclosure, a position of the first electrode pattern 1 is not particularly limited, and the first electrode pattern 1 may be disposed on a side of the first semiconductor layer 5 facing the light emitting layer 6, on a side of the first semiconductor layer 5 away from the light emitting layer 6, or on a side surface of the first semiconductor layer 5.

Referring to FIGS. 1 and 2, in the embodiment of the present disclosure, the first electrode pattern 1 may be disposed on the side surface of the first semiconductor layer 5, that is, an outline of an orthographic projection of the first electrode pattern 1 on a plane where the first semiconductor layer 5 is located completely surrounds or partially surrounds an outline of an orthographic projection of the first semiconductor layer 5 on a plane where the first semiconductor layer 5 is located. Further, the first electrode pattern 1 may be in contact with the side surface of the first semiconductor layer 5.

Figure 4:
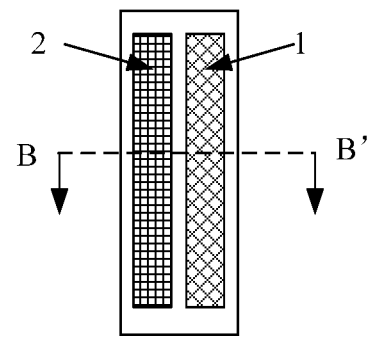
FIG. 4 is a schematic top view of an inorganic light emitting diode chip in the related art.
Figure 5:
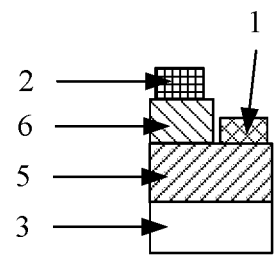
FIG. 5 is a schematic cross-sectional view taken along line B-B' of FIG. 4.

FIG. 4 is a schematic top view of an inorganic light emitting diode chip in the related art, and FIG. 5 is a schematic cross-sectional view taken along line B-B' in FIG. 4, as shown in FIGS. 4 and 5, in the related art, the first electrode pattern 1 is generally disposed on the side of the first semiconductor layer 5 facing the light emitting layer 6, so as to fix the inorganic light emitting diode chip on the driving substrate in a flip-chip manner. Since the first electrode patterns 1 and the second electrode patterns 2 are disposed on the side of the first semiconductor layer 5 facing the light emitting layer 6, the area where the second electrode patterns 2 can be disposed is relatively small, and the actual light emitting area of the inorganic light emitting diode chip is positively correlated to the area of the second electrode patterns 2, so that the actual light emitting area of the inorganic light emitting diode chip is relatively small.

In the embodiment of the present disclosure, unlike in the related art shown in FIGS. 3 and 4, the first electrode pattern 1 may be located on the side surface of the first semiconductor layer 5, so that the area of the first semiconductor layer 5 facing the light emitting layer 6 where the second electrode patterns 2 can be disposed is increased, that is, the area capable of being used by the second electrode patterns 2 is increased, which is beneficial to increasing the light emitting area of the inorganic light emitting diode chip. In addition, the design that the first electrode pattern 1 is arranged on the side surface of the first semiconductor layer 5 also enables the spacing between the actual light emitting areas of adjacent pixels to be reduced in a display device adopting the inorganic light emitting diode chip as a pixel, so that the problem of mura caused by overlarge spacing between the actual light emitting areas of adjacent pixels can be weakened or even eliminated, furthermore, when the 3D and double-view functions are realized by incorporating with a lens, continuous and gapless pixel arrangement can be realized, and the display effect can be greatly improved.

Figure 6:
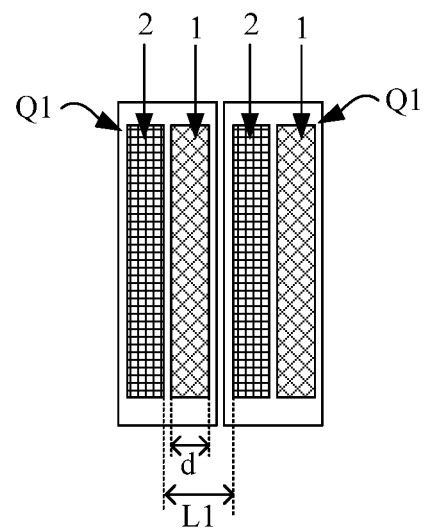
FIG. 6 is a schematic diagram of two adjacent micro inorganic light emitting diode chips and their actual light emitting areas in the related art.

FIG. 6 is a schematic diagram of two adjacent micro inorganic light emitting diode chips and their actual light emitting areas in the related art, as shown in FIG. 6, the actual light emitting area of the micro inorganic light emitting diode chip Q1 is determined by the second electrode patterns 2 (approximately the area where the second electrode pattern 2 is located), and in the case of not considering the spacing between the micro inorganic light emitting diode chips Q1, the spacing between the actual light emitting areas of the two adjacent micro inorganic light emitting diode chips Q1 in the related art is L1, and L1 is slightly larger than a width d of one first electrode pattern 1, that is, L1≈d.

Actual light emitting areas of the light emitting diodes in the display device are regularly arranged in a matrix manner, so that spacing areas in a dark state are regularly arranged; and since d is relatively large (generally in the micron order), the spacing area in dark state is relatively large, so that a user can observe the areas in dark state while observing the light emitting area, and the areas in dark state which are regularly arranged are coupled together to form obvious mura.

Figure 7:
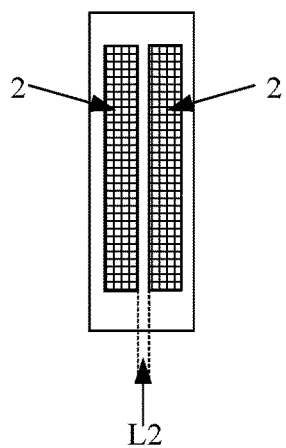
FIG. 7 is a schematic diagram of actual light emitting areas of two adjacent micro inorganic light emitting diode chips on an inorganic light emitting diode chip according to an embodiment of the present disclosure.

FIG. 7 is a schematic diagram of actual light emitting areas of two adjacent micro inorganic light emitting diode chips on an inorganic light emitting diode chip according to an embodiment of the present disclosure, and as shown in FIG. 7, the distance between two adjacent second electrode patterns 2 (two adjacent second semiconductor patterns 7) on a same inorganic light emitting diode chip can be infinitely close without considering the limitation of the manufacturing process. Therefore, the distance L2 between the actual light emitting areas of two adjacent micro inorganic light emitting diode chips on the inorganic light emitting diode chip can be much smaller than L1.

Figure 8:
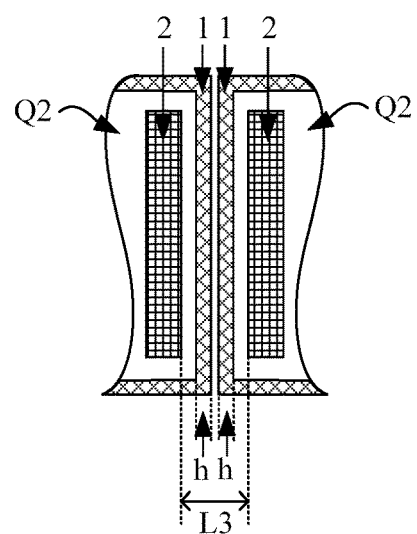
FIG. 8 is a schematic diagram of actual light emitting areas of two adjacent micro inorganic light emitting diode chips on different inorganic light emitting diode chips according to an embodiment of the present disclosure.

FIG. 8 is a schematic diagram of actual light emitting areas of two adjacent micro inorganic light emitting diode chips on different inorganic light emitting diode chips in an embodiment of the present disclosure, as shown in FIG. 8, without considering the spacing between the inorganic light emitting diode chips Q2, the spacing between the actual light emitting areas of two adjacent micro inorganic light emitting diode chips on different inorganic light emitting diode chips Q2 is L3, L3 is slightly larger than two times of a thickness h of the first electrode pattern 1, i.e., L3≈2h, h is generally nano-scale, d is generally micro-scale, d is much larger than h, so L3<L1.

Therefore, by providing the first electrode pattern 1 on the side surface of the first semiconductor layer 5, the spacing between adjacent actual light emitting areas in the display device can be reduced, that is, the area of the spacing area in the dark state is reduced, and the spacing area in the dark state is difficult to be observed by a user, which is beneficial to reducing or even eliminating mura.

Figure 9:
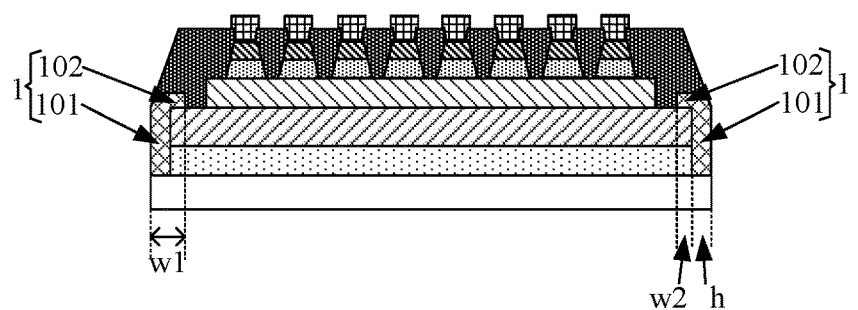
FIG. 9 is another schematic cross-sectional view taken along line A-A' of FIG. 1.

FIG. 9 is another schematic sectional view taken along line A-A' in FIG. 2, and as shown in FIG. 9, unlike the case shown in FIG. 3, the first electrode pattern 1 shown in FIG. 9 includes not only a first part 101 disposed on the side surface of the first semiconductor layer 5 but also a second part 102 disposed on the side of the first semiconductor layer 5 facing the light emitting layer 6. This is because in an actual production process, since the thickness h of the first electrode pattern 1 is relatively small, if the requirement for the accuracy of the position of the first electrode pattern 1 in the process of preparing the first electrode pattern 1 is too high, and a line width w1 of the first electrode pattern 1 is usually designed to be larger than the thickness h, so that the actually prepared first electrode pattern 1 may have the second part 102 overlapping the side of the first semiconductor layer 5 facing the light emitting layer 6. In the case shown in FIG. 9, since the first electrode pattern 1 is substantially located on the side surface of the first semiconductor layer 5, such a case should also fall within the scope of the present disclosure.

In an actual production process, the smaller the width w2 (w2=w1−h) of the second part 102 is, the larger the area capable of being used by the second electrode patterns 2 is, and the larger the actual light emitting area is; in some implementations, w2<1 μm.

In addition, in the embodiment of the present disclosure, the first electrode patterns 1 may cover a partial area of the side surface of the first semiconductor layer 5, or may cover the entire area of the side surface of the first semiconductor layer 5, which all fall within the protection scope of the present disclosure.

With continued reference to FIGS. 3 and 9, in some implementations, the inorganic light emitting diode chip of the embodiment of the present disclosure may further include: an insulating layer 4; the insulating layer 4 is disposed on a side of the second semiconductor layer away from the light emitting layer 6, and a plurality of via holes corresponding to the second semiconductor patterns 7 are formed in the insulating layer 4; the second electrode layer is located on a side of the insulating layer 4 away from the second semiconductor layer, and the second electrode patterns 2 are electrically coupled to the second semiconductor patterns 7 through the via holes correspondingly.

In some implementations, the inorganic light emitting diode chip of the embodiment of the present disclosure may further include: a transparent electrode 9, the transparent electrode 9 being disposed between the second electrode pattern 2 and the corresponding second semiconductor pattern 7. The transparent electrode 9 may be made of a transparent metal oxide material, such as indium tin oxide. By providing the transparent electrode 9 between the second electrode pattern 2 and the corresponding second semiconductor pattern 7, the contact resistance between the second electrode pattern 2 and the corresponding second semiconductor pattern 7 can be effectively reduced.

In some implementations, an orthographic projection of the light emitting layer 6 on the plane where the first semiconductor layer 5 is located is in the area where the first semiconductor layer 5 is located, and the orthographic projection of the light emitting layer 6 on the plane where the first semiconductor layer 5 is located covers a partial area of the first semiconductor layer 5. That is, the side surface of the light emitting layer 6 and the side surface of the first semiconductor layer 5 form a step, which is designed to prevent the first electrode pattern 1 from contacting the side surface of the light emitting layer 6 when the first electrode pattern 1 is prepared on the side surface of the first semiconductor layer 5, as will be described in detail later.

In some implementations, the inorganic light emitting diode chip of the embodiment of the present disclosure may further include a buffer layer 8, the buffer layer 8 being disposed on a side of the first semiconductor layer 5 away from the light emitting layer 6; as an example, a material of the buffer layer 8 may be gallium nitride.

In some implementations, the inorganic light emitting diode chip of the embodiment of the present disclosure may further include a substrate 3, the substrate 3 being located on a side of the buffer layer 8 away from the first semiconductor layer 5. The substrate 3 may be made of any suitable material; as an example, the substrate 3 may be a sapphire substrate (the main component is alumina).

It should be noted that, during the process of preparing the inorganic light emitting diode chip, the substrate 3 is an essential structure in order to satisfy the process conditions such as lattice matching and thermal expansion coefficient matching, but the substrate 3 may be removed after the preparation of the inorganic light emitting diode chip is completed, so the substrate 3 is an unnecessary structure for the whole inorganic light emitting diode chip product.

Figure 10:
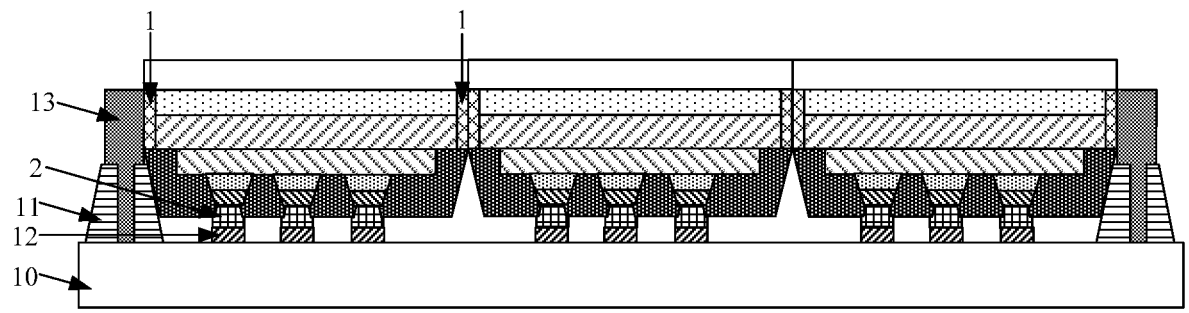
FIG. 10 is a schematic cross-sectional view of a partial area of a display device according to an embodiment of the present disclosure.

FIG. 10 is a schematic cross-sectional view of a partial area of a display device according to an embodiment of the present disclosure, and as shown in FIG. 10, the display device includes the inorganic light emitting diode chip provided in the foregoing embodiment, and for specific description of the inorganic light emitting diode chip, reference may be made to corresponding contents in the foregoing embodiment, which is not repeated herein. The display device provided by the embodiment of the present disclosure may be a micro inorganic light emitting diode display device.

In some implementations, the display device further includes a driving substrate including a driving functional layer 10 and a pixel defining layer 11. The driving functional layer 10 generally includes a driving circuit and/or signal lines (not shown), and coupling terminals to be bonded to the inorganic light emitting diode chip, where each of the coupling terminals is configured to be coupled to an electrode pattern in the inorganic light emitting diode chip, and the signal lines can provide electrical signals for the coupling terminals to drive the inorganic light emitting diode chip. In the embodiment of the present disclosure, the driving functional layer 10 may adopt a structure of an existing driving functional layer, and a specific structure of the driving functional layer 10 is not particularly limited by the present disclosure.

In some implementations, the driving functional layer 10 includes: a plurality of first coupling terminals 12, and the pixel defining layer 11 defines a plurality of pixel accommodating holes, each of which corresponds to one or more inorganic light emitting diode chips; more than one of the first coupling terminals 12 are disposed in each of the pixel accommodating holes, each inorganic light emitting diode chip is flip-mounted in the corresponding pixel accommodating hole, and the second electrode patterns 2 are electrically coupled to the first coupling terminals 12 in the corresponding pixel accommodating hole. In practical applications, the second electrode patterns 2 may be bonded to the corresponding first coupling terminals 12 through a die bonding process.

In some implementations, the first electrode pattern 1 is located at the side surface of the first semiconductor layer 5, and at least a part of the first electrode pattern 1 protrudes from a side of the pixel accommodating hole away from the driving functional layer 10.

Referring to FIG. 10, each pixel accommodating hole corresponds to a plurality of inorganic light emitting diode chips; for the inorganic light emitting diode chips corresponding to the same pixel accommodating hole, first electrode patterns 1 of adjacent inorganic light emitting diode chips are in contact with each other, so that the first electrode patterns 1 of the inorganic light emitting diode chips in the same pixel accommodating hole can be electrically coupled.

In some implementations, the pixel accommodating hole is configured with at least one corresponding second coupling terminal 13, the second coupling terminal 13 is located on a side of the pixel defining layer 11 away from the driving functional layer 10, and the second coupling terminal 13 is electrically coupled to a corresponding signal line (generally, a cathode voltage supply line, providing a low-level voltage VSS) in the driving functional layer 10; among the inorganic light emitting diode chips corresponding to the same pixel accommodating hole, the first electrode pattern 1 of at least one inorganic light emitting diode chip located at the outermost side is electrically coupled to the second coupling terminal 13 corresponding to the pixel accommodating hole. In such case, the electrical signal in the corresponding signal line can be transmitted to the inorganic light emitting diode chips corresponding to the pixel accommodating hole through the second coupling terminal 13 disposed for the pixel accommodating hole.

It should be noted that FIG. 10 only shows one pixel accommodating hole for example, and the one pixel accommodating hole corresponds to three inorganic light emitting diode chips, and each inorganic light emitting diode chip is provided with three second electrode patterns 2, i.e., each inorganic light emitting diode chip is divided into three micro inorganic light emitting diode chips. This case is only exemplary, and does not limit the technical solution of the present disclosure. In actual production, the number and distribution of the pixel accommodating holes and the number of the inorganic light emitting diode chips corresponding to each pixel accommodating hole may be set according to actual requirements.

In the process of manufacturing the display device shown in FIG. 10, preparations of inorganic light emitting diode chips and the driving substrate (including the second coupling terminal 13) are first completed respectively, and then the inorganic light emitting diode chips are transferred onto the driving substrate. Specifically, the second electrode patterns 2 may be first coupled to the corresponding first coupling terminals 12 through a die bonding process, and then the first electrode pattern 1 of the inorganic light emitting diode chip located at the outermost side of the pixel accommodating hole may be coupled to the second coupling terminal 13. The technical solution of the present disclosure does not specifically limit the manner in which the first electrode pattern 1 and the second coupling terminal 13 are coupled, for example, the first electrode pattern and the second coupling terminal may be tightly attached to each other, fixed by welding, or fixed by conductive adhesive.

It should be noted that the coupling between the first electrode pattern 1 and the second coupling terminal 13 may be performed after each transferring process is completed, or may be performed after all the inorganic light emitting diode chips are transferred.

Figure 11:
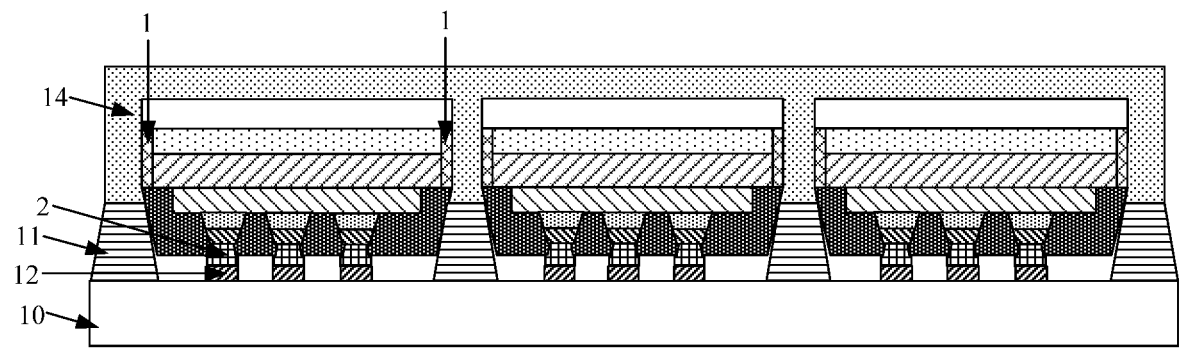
FIG. 11 is a schematic cross-sectional view of a partial area of a display device according to an embodiment of the present disclosure.

FIG. 11 is a schematic cross-sectional view of a partial area of a display device according to an embodiment of the present disclosure, as shown in FIG. 11, different from that shown in FIG. 10, in the case of FIG. 11, each pixel accommodating hole corresponds to one inorganic light emitting diode chip, a conductive electrode 14 (also referred to as a cathode electrode) is disposed on a side of the pixel accommodating hole away from the driving functional layer 10, and the conductive electrode 14 is electrically coupled to a corresponding signal line (generally, a cathode voltage supply line, which provides a low-level voltage VSS) in the driving functional layer 10; first electrode patterns 1 of the inorganic light emitting diode chips are electrically coupled through the conductive electrode 14.

In the process of manufacturing the display device shown in FIG. 11, preparations of inorganic light emitting diode chips and the driving substrate (including the second coupling terminal 13) are first completed respectively, and then the inorganic light emitting diode chips are transferred to the driving substrate in batches, and the conductive electrode 14 may be prepared after all the inorganic light emitting diode chips are transferred.

In some implementations, the display device may further include a protective layer and a cover plate (not shown) on a side of the inorganic light emitting diode chips away from the driving substrate.

Figure 12:
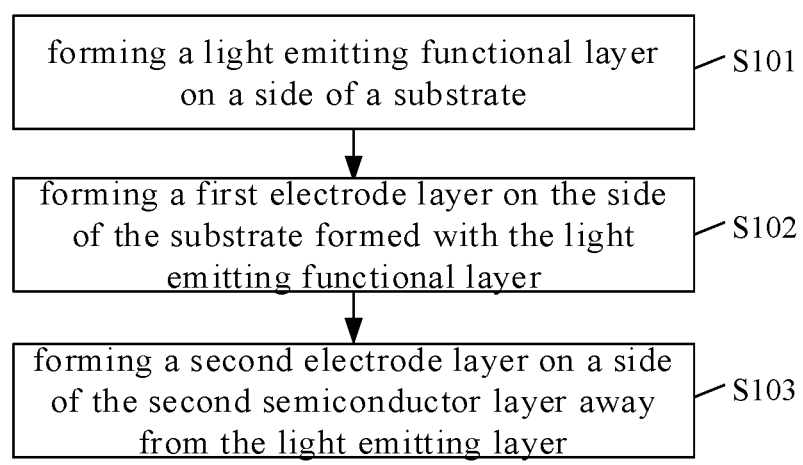
FIG. 12 is a flowchart of a method for manufacturing an inorganic light emitting diode chip according to an embodiment of the present disclosure.

FIG. 12 is a flowchart of a method for manufacturing an inorganic light emitting diode chip according to an embodiment of the present disclosure, and as shown in FIG. 12, the method is suitable for manufacturing the inorganic light emitting diode chip according to the previous embodiment, and the method includes the following steps S101 to S103.

At step S101, a light emitting functional layer is formed on a side of a substrate.

The light emitting functional layer includes a first semiconductor layer, a light emitting layer and a second semiconductor layer which are sequentially stacked, and the second semiconductor layer includes a plurality of second semiconductor patterns which are arranged at intervals.

At step S102, a first electrode layer is formed on the side of the substrate formed with the light emitting functional layer.

The first electrode layer includes a first electrode pattern electrically coupled to the first semiconductor layer.

At step S103, a second electrode layer is formed on a side of the second semiconductor layer away from the light emitting layer.

The second electrode layer includes a plurality of second electrode patterns corresponding to the second semiconductor patterns one to one, each second electrode pattern is electrically coupled to the second semiconductor pattern corresponding thereto.

Figure 13:
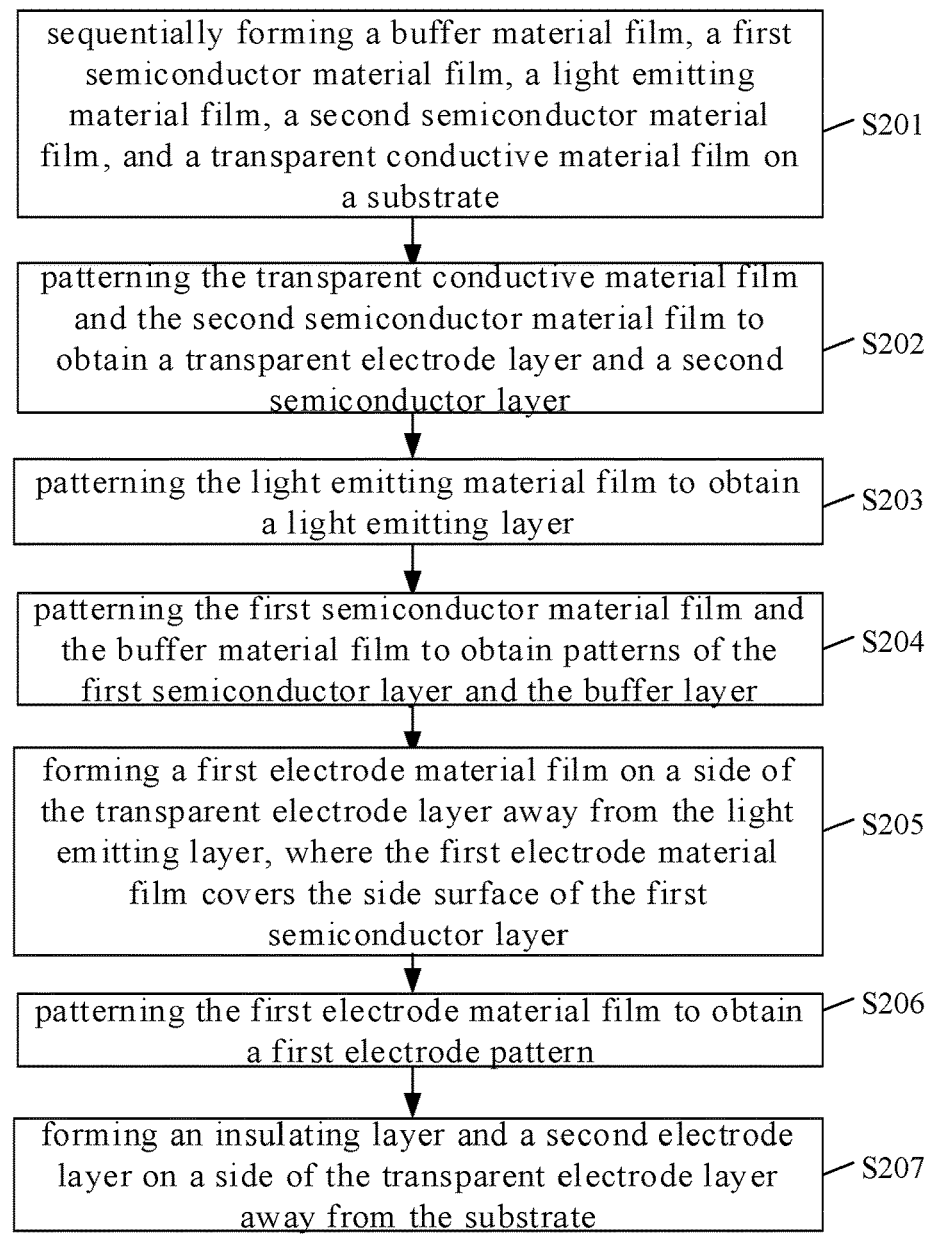
FIG. 13 is another flowchart of a method for manufacturing an inorganic light emitting diode chip according to an embodiment of the present disclosure.
Figure 14A:
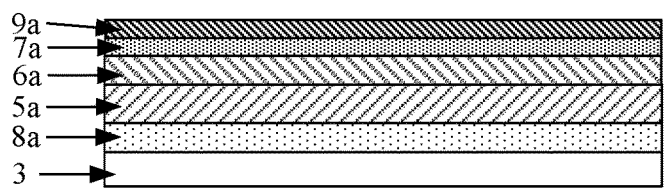
FIGS. 14a to 14e are schematic intermediate structural diagrams of an inorganic light emitting diode chip manufactured by the method shown in FIG. 13.
Figure 14B:
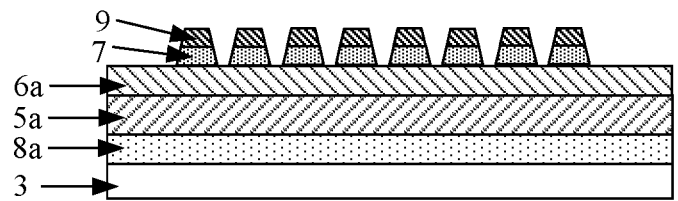
Figure 14C:
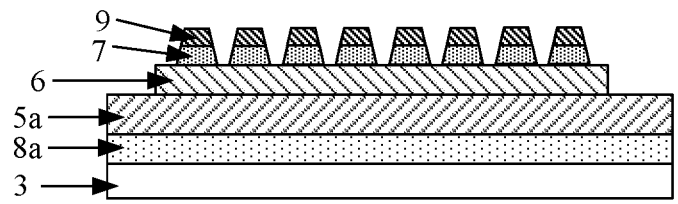
Figure 14D:
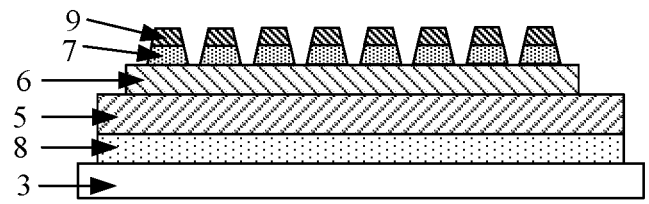
Figure 14E:
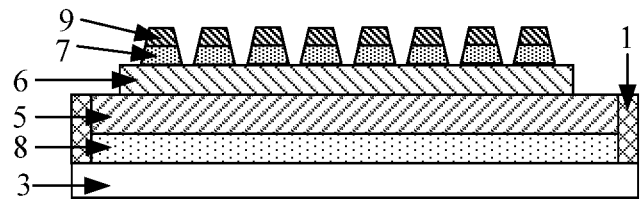

FIG. 13 is another flowchart of a method for manufacturing an inorganic light emitting diode chip according to an embodiment of the present disclosure, and FIGS. 14a to 14e are schematic intermediate structural diagrams of the inorganic light emitting diode chip manufactured by the method shown in FIG. 13, as shown in FIGS. 13 to 14e, the method is suitable for manufacturing the inorganic light emitting diode chip according to the previous embodiment, and the method includes the following steps S201 to S207.

At step S201, a buffer material film, a first semiconductor material film, a light emitting material film, a second semiconductor material film, and a transparent conductive material film are sequentially formed on a substrate.

Referring to FIG. 14a, at step S201, a buffer material film 8a, a first semiconductor material film 5a, a light emitting material film 6a, a second semiconductor material film 7a, and a transparent conductive material film 9a are sequentially formed on the substrate 3 through a deposition process, and for specific materials of the respective films, it may refer to the description in the previous embodiment.

In some implementations, the buffer material film 8a and/or the transparent conductive material film 9a may be omitted.

At step S202, a patterning process is performed on the transparent conductive material film and the second semiconductor material film to obtain a transparent electrode layer and a second semiconductor layer.

Referring to FIG. 14b, the transparent electrode layer includes a plurality of transparent electrodes 9 disposed at intervals, and the second semiconductor layer includes a plurality of second semiconductor patterns 7 disposed at intervals. The transparent conductive material film and the second semiconductor material film may be patterned simultaneously by one patterning process, or the transparent conductive material film and the second semiconductor material film may be patterned separately by two patterning processes.

At step S203, a patterning process is performed on the light emitting material film to obtain a light emitting layer.

Referring to FIG. 14c, the pattern of the light emitting layer 6 is obtained by patterning the light emitting material thin film, and the light emitting layer 6 is entirely plate-shaped.

At step S204, a patterning process is performed on the first semiconductor material film and the buffer material film to obtain patterns of the first semiconductor layer and the buffer layer.

As shown in FIG. 14d, the patterns of the first semiconductor layer 5 and the buffer layer 8 are obtained by patterning the first semiconductor material film and the buffer material film, and the entire pattern of the first semiconductor layer 5 is plate-shaped and the side surface thereof is exposed. In some implementations, the patterns of the first semiconductor layer 5 and the buffer layer 8 are the same.

An orthographic projection of the light emitting layer 6 on a plane where the first semiconductor layer 5 is located is in the area where the first semiconductor layer 5 is located, and the orthographic projection of the light emitting layer 6 on the plane where the first semiconductor layer 5 is located covers a partial area of the first semiconductor layer 5, namely, the side surface of the light emitting layer 6 and the side surface of the first semiconductor layer 5 form a step shape.

At step S205, a first electrode material film is formed on a side of the transparent electrode layer away from the light emitting layer, where the first electrode material film covers the side surface of the first semiconductor layer.

Since the side surface of the light emitting layer 6 and the side surface of the first semiconductor layer 5 form a step shape, a certain distance exists between a part of the first electrode material film covering the side surface of the first semiconductor layer 5 and a part of the first electrode material film covering the side surface of the light emitting layer 6 in the horizontal direction (parallel to the plane where the substrate is located), and then when the first electrode material film is etched, the part of the first electrode material film covering the side surface of the light emitting layer can be completely removed, so that the first electrode pattern is prevented from being coupled to the light emitting layer.

At step S206, a patterning process is performed on the first electrode material film to obtain a first electrode pattern, and the first electrode pattern is located on the side surface of the first semiconductor layer and contacts the side surface of the first semiconductor layer.

Referring to FIG. 14e, a patterning process is performed on the first electrode material film to remove a part of the first electrode material film that is not located on the side surface of the first semiconductor layer 5. It should be noted that, as described in the case shown in FIG. 9, in consideration of the difficulty of the process, the edge part (i.e., the second part 102 in FIG. 9) of the first electrode material film on the surface of the first semiconductor layer 5 facing the light emitting layer 6 may be reserved in the actual production.

At step S207, an insulating layer and a second electrode layer are formed on a side of the transparent electrode layer away from the substrate. Referring to FIGS. 3 and 9, firstly, an insulating layer 4 is formed on a side of the transparent electrode layer away from the substrate, the insulating layer 4 being provided with a plurality of via holes corresponding to the second semiconductor patterns 7 one to one, then a second conductive material film is formed on the insulating layer, and then the second conductive material film is patterned to obtain a pattern of the second electrode layer;

the second electrode layer includes a plurality of second electrode patterns 2 corresponding to the second semiconductor patterns 7 one to one, and the second electrode patterns 2 are electrically coupled to the corresponding second semiconductor patterns 7 respectively through the via holes.

It should be noted that, when the inorganic light emitting diode chip is flip-chip mounted on the driving substrate, the insulating layer on the inorganic light emitting diode chip may also serve to fill and seal the pixel accommodating hole.

In some implementations, after the preparation of the inorganic light emitting diode chip is completed, the inorganic light emitting diode chip may be separated from the substrate.

It will be understood that the above implementations are merely exemplary implementations employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

The invention claimed is:

1. A display device, comprising a light emitting diode chip, wherein the light emitting diode chip comprises:
    a light emitting functional layer comprising a first semiconductor layer, a light emitting layer and a second semiconductor layer which are sequentially stacked, and the second semiconductor layer comprises a plurality of second semiconductor patterns which are arranged at intervals;
    a first electrode layer comprising a first electrode pattern electrically coupled to the first semiconductor layer; and
    a second electrode layer disposed on a side, away from the light emitting layer, of the second semiconductor layer and comprising a plurality of second electrode patterns in one-to-one correspondence with the second semiconductor patterns, and the second electrode patterns are electrically coupled to the second semiconductor patterns correspondingly,
    wherein the first electrode pattern is disposed on a side surface of the first semiconductor layer, so that an orthographic projection of the first electrode pattern on a plane in which the first semiconductor layer is located is at least partially not overlapped with the first semiconductor layer,
    the display device further comprises: a driving substrate;
    the driving substrate comprises a driving functional layer and a pixel defining layer, wherein the driving functional layer comprises a plurality of first coupling terminals, the pixel defining layer defines a plurality of pixel accommodating holes, and each of the pixel accommodating holes corresponds to more than one light emitting diode chips,
    more than one of the first coupling terminals are disposed in each of the pixel accommodating holes, and each of the light emitting diode chips is flip-mounted in a corresponding one of the pixel accommodating holes, and the second electrode patterns are electrically coupled to the first coupling terminals in the corresponding one of the pixel accommodating holes,
    wherein at least a part of the first electrode pattern protrudes from a side of the pixel accommodating hole away from the driving functional layer,
    for the light emitting diode chips corresponding to any one pixel accommodating hole, first electrode patterns of adjacent ones of the light emitting diode chips are in contact with each other,
    the pixel accommodating hole is configured with at least one second coupling terminal disposed on a side of the pixel defining layer away from the driving functional layer, the second coupling terminal being electrically coupled to a corresponding signal line in the driving functional layer, and
    for the light emitting diode chips corresponding to any one pixel accommodating hole, the first electrode pattern of at least one light emitting diode chip disposed on an outermost side is electrically coupled to the second coupling terminal corresponding to the pixel accommodating hole.

2. The display device of claim 1, wherein the first electrode pattern is in contact with the side surface of the first semiconductor layer.

3. The display device of claim 1, wherein the light emitting diode chip further comprises an insulating layer, the insulating layer is disposed on a side, away from the light emitting layer, of the second semiconductor layer, and a plurality of via holes corresponding to the second semiconductor patterns are formed in the insulating layer;
    the second electrode layer is disposed on a side, away from the second semiconductor layer, of the insulating layer, and the second electrode patterns are electrically coupled to the second semiconductor patterns correspondingly through the via holes.

4. The display device of claim 1, wherein the light emitting diode chip further comprises a transparent electrode disposed between the second electrode pattern and the corresponding second semiconductor pattern.

5. The display device of claim 1, wherein an orthographic projection of the light emitting layer on a plane where the first semiconductor layer is located is within an area where the first semiconductor layer is located, and the orthographic projection of the light emitting layer on the plane where the first semiconductor layer is located covers a partial area of the first semiconductor layer.

6. The display device of claim 1, wherein the light emitting diode chip further comprises a buffer layer disposed on a side, away from the light emitting layer, of the first semiconductor layer.

* * * * *